US007759778B2

United States Patent
Lowry et al.

(10) Patent No.: US 7,759,778 B2
(45) Date of Patent: Jul. 20, 2010

(54) LEADED SEMICONDUCTOR POWER MODULE WITH DIRECT BONDING AND DOUBLE SIDED COOLING

(75) Inventors: Michael J. Lowry, Indianapolis, IN (US); Eric A. Brauer, Avon, IN (US); Thomas A. Degenkolb, Noblesville, IN (US); Victor C. M. Wong, Singapore (SG)

(73) Assignee: Delphi Technologies, Inc., Troy, MI (US)

( * ) Notice: Subject to any disclaimer, the term of this patent is extended or adjusted under 35 U.S.C. 154(b) by 20 days.

(21) Appl. No.: 12/283,647

(22) Filed: Sep. 15, 2008

(65) Prior Publication Data

US 2010/0065950 A1 Mar. 18, 2010

(51) Int. Cl.
*H01L 23/495* (2006.01)

(52) U.S. Cl. .................. 257/675; 257/692; 257/787; 257/E23.049

(58) Field of Classification Search ............ 257/666, 257/675, 706, 712, 13, 717, 720, 725, 690, 257/692, 693, 786, 787, 796, E23.004, E23.043, 257/E23.046, E23.047, E23.049, E23.059
See application file for complete search history.

(56) References Cited

U.S. PATENT DOCUMENTS

| 6,873,043 | B2 | 9/2004 | Oman | |
|---|---|---|---|---|
| 6,972,479 | B2 * | 12/2005 | Chen et al. | 257/666 |
| 7,030,317 | B1 | 4/2006 | Oman | |
| 7,145,254 | B2 * | 12/2006 | Hirano et al. | 257/796 |
| 2008/0290486 | A1 * | 11/2008 | Chen et al. | 257/676 |
| 2009/0004782 | A1 * | 1/2009 | Yu et al. | 438/123 |

* cited by examiner

*Primary Examiner*—Davienne Monbleau
*Assistant Examiner*—Dilinh P Nguyen
(74) *Attorney, Agent, or Firm*—Jimmy L. Funke

(57) ABSTRACT

A leaded semiconductor power module includes a first heatsink, an electrically insulated substrate thermally coupled to the first heatsink, one or more semiconductor chips, a leadframe substrate, and a second heatsink thermally coupled to the leadframe substrate, the assembly being overmolded with an encapsulant to expose the first heatsink, the second heatsink and peripheral terminals of the leadframe substrate. The semiconductor chips are electrically and structurally coupled to both the insulated substrate and the leadframe substrate, and conductive spacers electrically and structurally couple the insulated substrate to the leadframe substrate.

5 Claims, 7 Drawing Sheets

US 7,759,778 B2

LEADED SEMICONDUCTOR POWER MODULE WITH DIRECT BONDING AND DOUBLE SIDED COOLING

TECHNICAL FIELD

The present invention relates to a power semiconductor power module that includes power and control leads, and that is configured for both top-side and bottom-side cooling.

BACKGROUND OF THE INVENTION

Semiconductor modules used in power switching applications can include one or more current control devices such as power IGBTs or power MOSFETs and power diodes. For example, a common configuration for inverter and converter applications includes two power transistors and two power diodes in the form of a half-H bridge circuit. In order to optimize reliability and heat rejection, manufacturers have tended to minimize or eliminate wire bonding and to design the modules for double sided cooling. For example, the U.S. Pat. No. 6,873,043 to Oman discloses a surface-mount or lead-less package configuration in which a power transistor die having top-side and bottom-side contacts is sandwiched between a pair of copper-clad substrates bonded directly to the die contacts. The direct electrical and structural attachment eliminates wire bonds, and heat generated by the die is rejected through both substrates. The object of the present invention is to achieve these same objectives in a leaded semiconductor power module.

SUMMARY OF THE INVENTION

The present invention is directed to a leaded semiconductor power module including a first heatsink, an electrically insulated substrate thermally coupled to the first heatsink, one or more semiconductor chips, a leadframe substrate, and a second heatsink thermally coupled to the leadframe substrate, the assembly being overmolded to expose the first heatsink, the second heatsink and peripheral terminals of the leadframe substrate. The semiconductor chips are direct bond coupled to both the insulated substrate and the leadframe substrate, and conductive spacers electrically and structurally couple the insulated substrate to the leadframe substrate.

DESCRIPTION OF THE PREFERRED EMBODIMENT

Figure 1A:
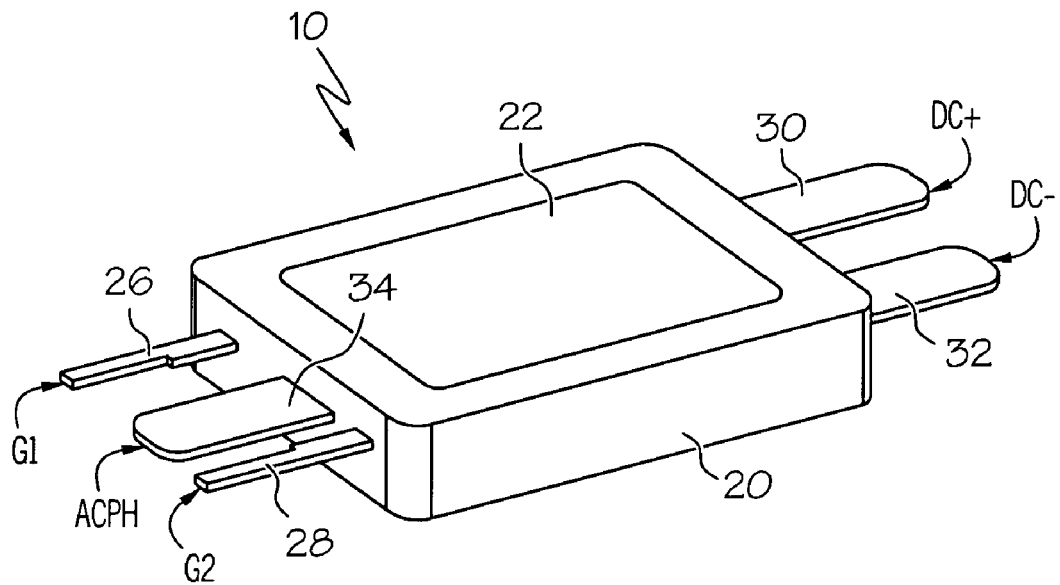
FIG. 1A is a first isometric view of an un-finned leaded semiconductor power module according to the present invention.
Figure 1B:
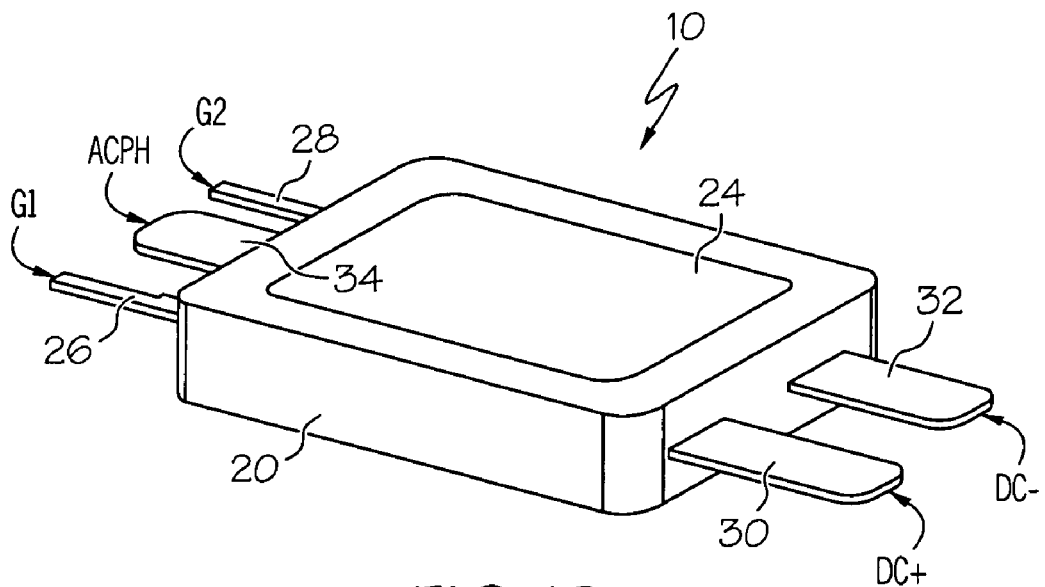
FIG. 1B is a second isometric view of the leaded semiconductor power module of FIG. 1A.
Figure 1C:
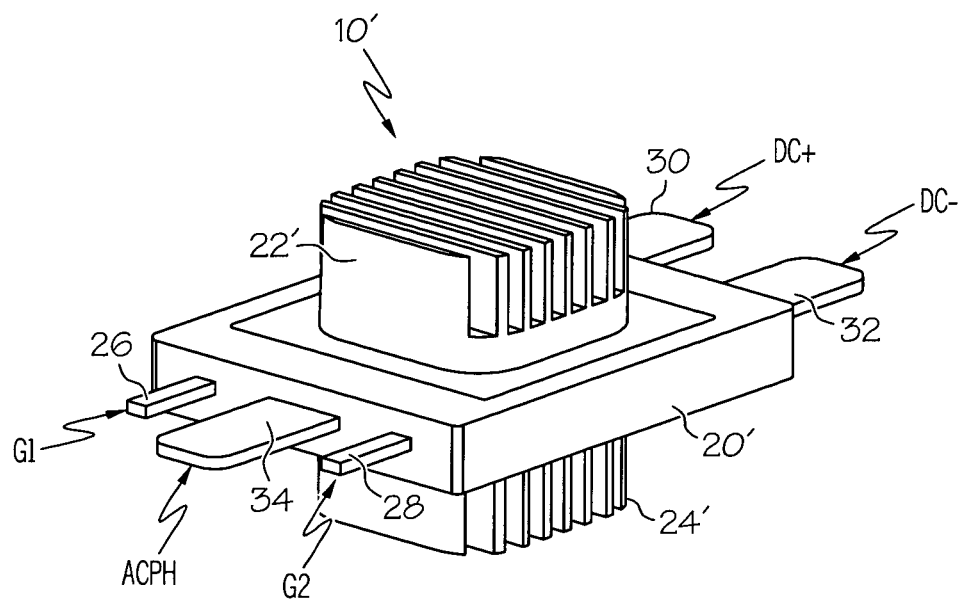
FIG. 1C is an isometric view of a finned leaded semiconductor power module according to the present invention.
Figure 1D:
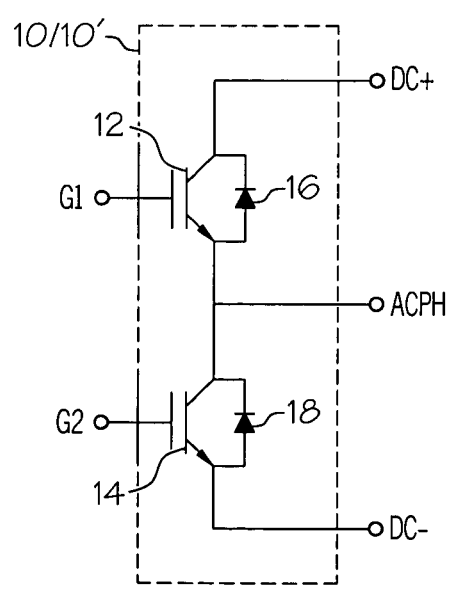
FIG. 1D is a circuit diagram for the leaded semiconductor power modules of FIGS. 1A-1C.

Referring to the drawings, FIGS. 1A-1D depict exemplary half-H bridge versions of a leaded semiconductor power module according to this invention. Other circuit variants such as a single switching device, parallel-connected switching devices, and a full-H bridge are also included within the scope of the invention. FIGS. 1A-1B depict a first version of the power module, designated generally by the reference numeral 10; FIG. 1C depicts a second version of the module, designated generally by the reference numeral 10'; and FIG. 1D is a diagram of the half-H bridge circuit.

Referring first to FIG. 1D, the half-H bridge circuit includes upper and lower insulated-gate power bipolar transistors (IGBTs) 12 and 14, and associated anti-parallel diodes 16 and 18. The circuit components 12-18 are coupled to a set of module terminals, including gate terminals G1 and G2 respective connected to the gates of IGBTs 12 and 14, direct voltage terminals DC+ and DC- respectively connected to the collector of IGBT 12 (and cathode of diode 16) and the emitter of IGBT 14 (and anode of diode 18), and an AC phase terminal ACPH connected to the emitter of IGBT 12 (and anode of diode 16) and the collector of IGBT 14 (and cathode of diode 18). In an alternate implementation, the IGBTs 12 and 14 may be replaced with power MOSFETs, power diodes, or some other vertical integrated circuit devices.

Referring to FIGS. 1A-1C, the power modules 10, 10' are overmolded with an encapsulant 20, 20' such that the aforementioned terminals G1, G2, DC+, DC-, ACPH and upper and lower heatsinks 22, 22' and 24, 24' remain exposed. The exposed terminals G1, G2, DC+, DC-, ACPH are electrically coupled to external circuitry and/or bus bars to define a DC-to-AC inverter, for example. In the configuration of FIGS. 1A-1B, the upper and lower heatsinks 22 and 24 are planar, and in a typical application are thermally coupled to planar regions of a housing to dissipate heat generated by the module 10. In the configuration of FIG. 1C, the upper and lower heatsinks 22' and 24' are finned to promote efficient heat transfer to air or a fluid coolant. Other heatsink variants are possible, of course; for example, one of the heatsinks may be planar and the other finned, and so forth. The significant aspect is that the modules 10, 10' are configured for double-sided (i.e., top-side and bottom-side) cooling.

As further explained below, the terminals G1, G2, DC+, DC-, ACPH are defined by the outboard ends of an equal number of metal leadframe segments 26, 28, 30, 32, 34 initially joined by metal bridge segments 36 that are removed after the overmolding process. The bridge segments 36 are located so that they are exposed—that is, not covered by the encapsulant 20, 20'—and then severed so that the leadframe segments formerly joined by the bridge segments 36 become electrically distinct terminals.

Figure 2A:
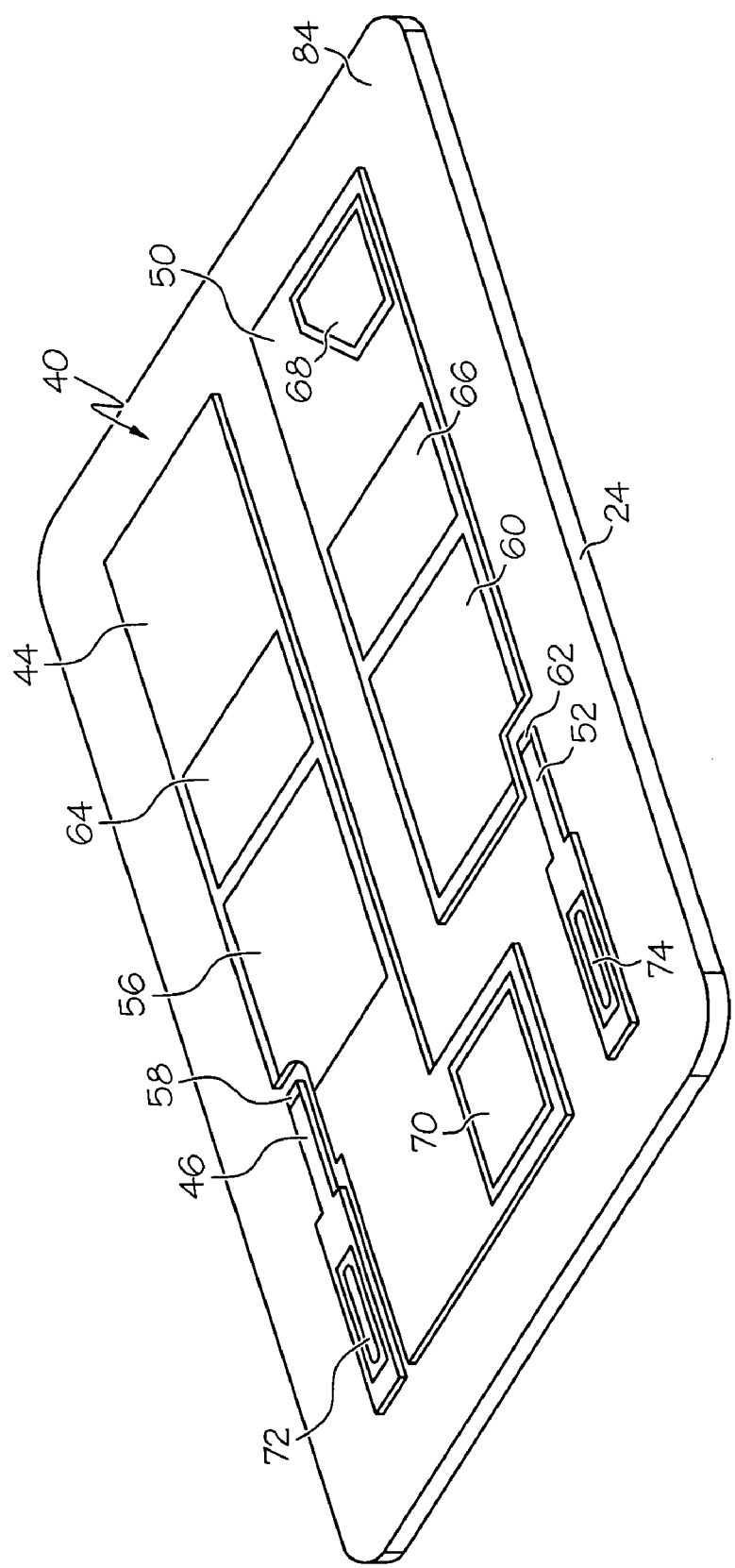
FIG. 2A is an isometric view of a lower heatsink and insulated substrate for the leaded semiconductor power module of FIGS. 1A-1B.
Figure 2B:
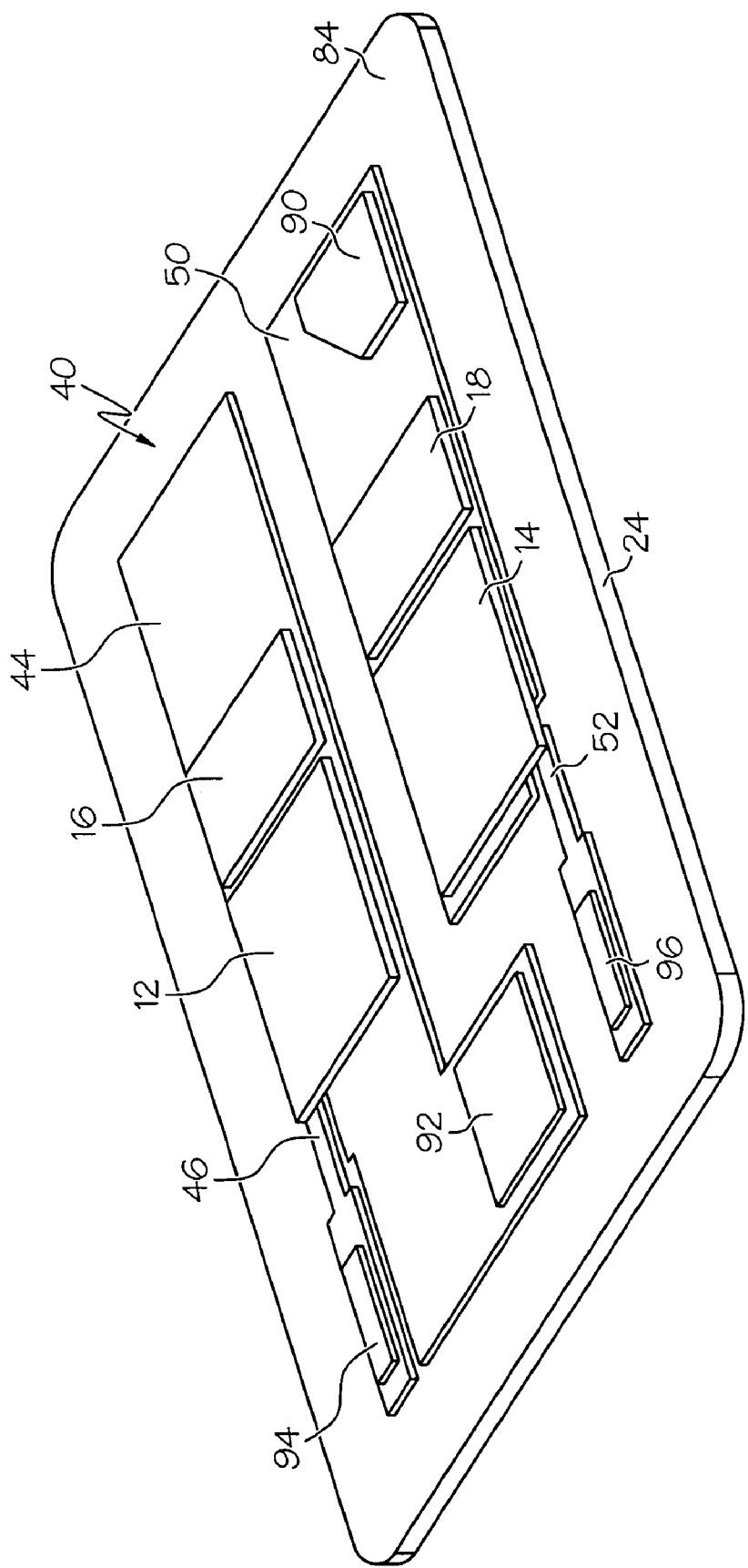
FIG. 2B is an isometric view of the lower heatsink and insulated substrate of FIG. 2A, with semiconductor chips mounted on the insulated substrate.
Figure 2C:
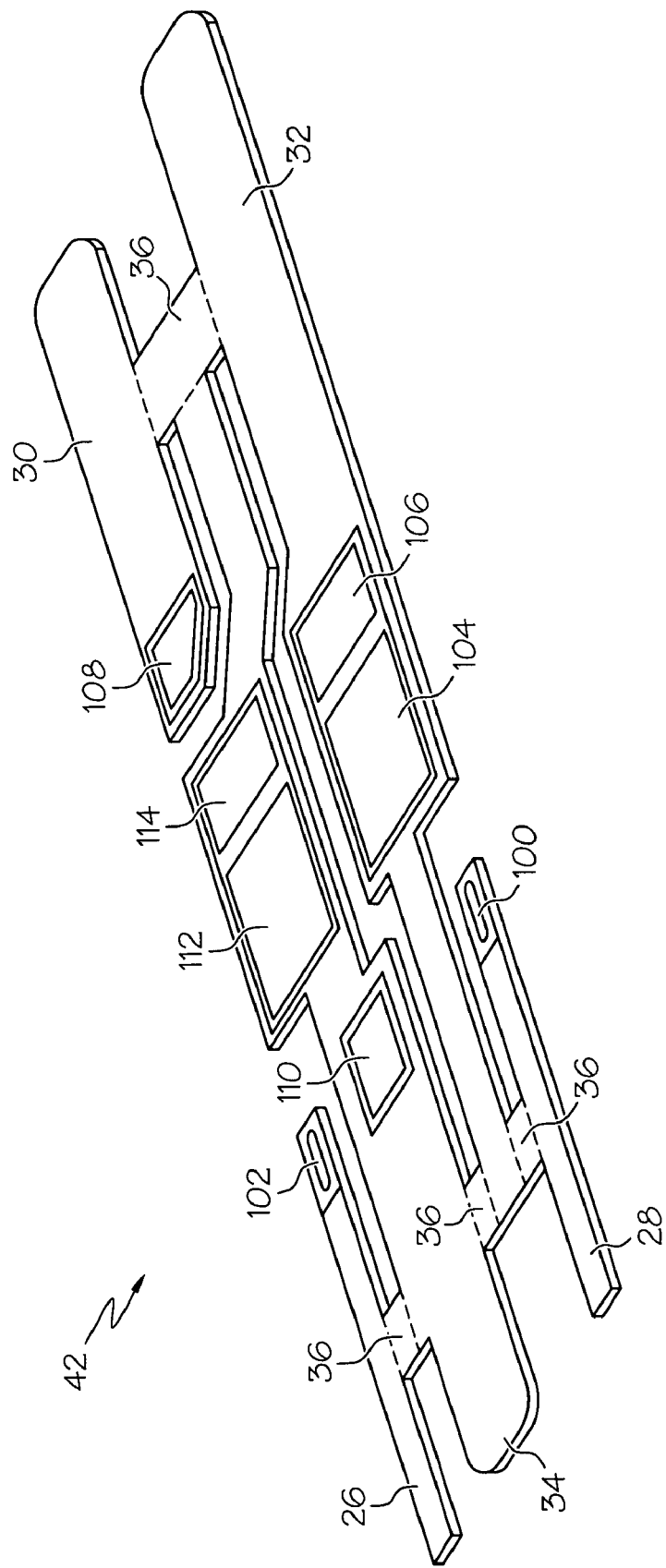
FIG. 2C is an isometric view of a leadframe substrate for the leaded semiconductor power modules of FIGS. 1A-1C.
Figure 2D:
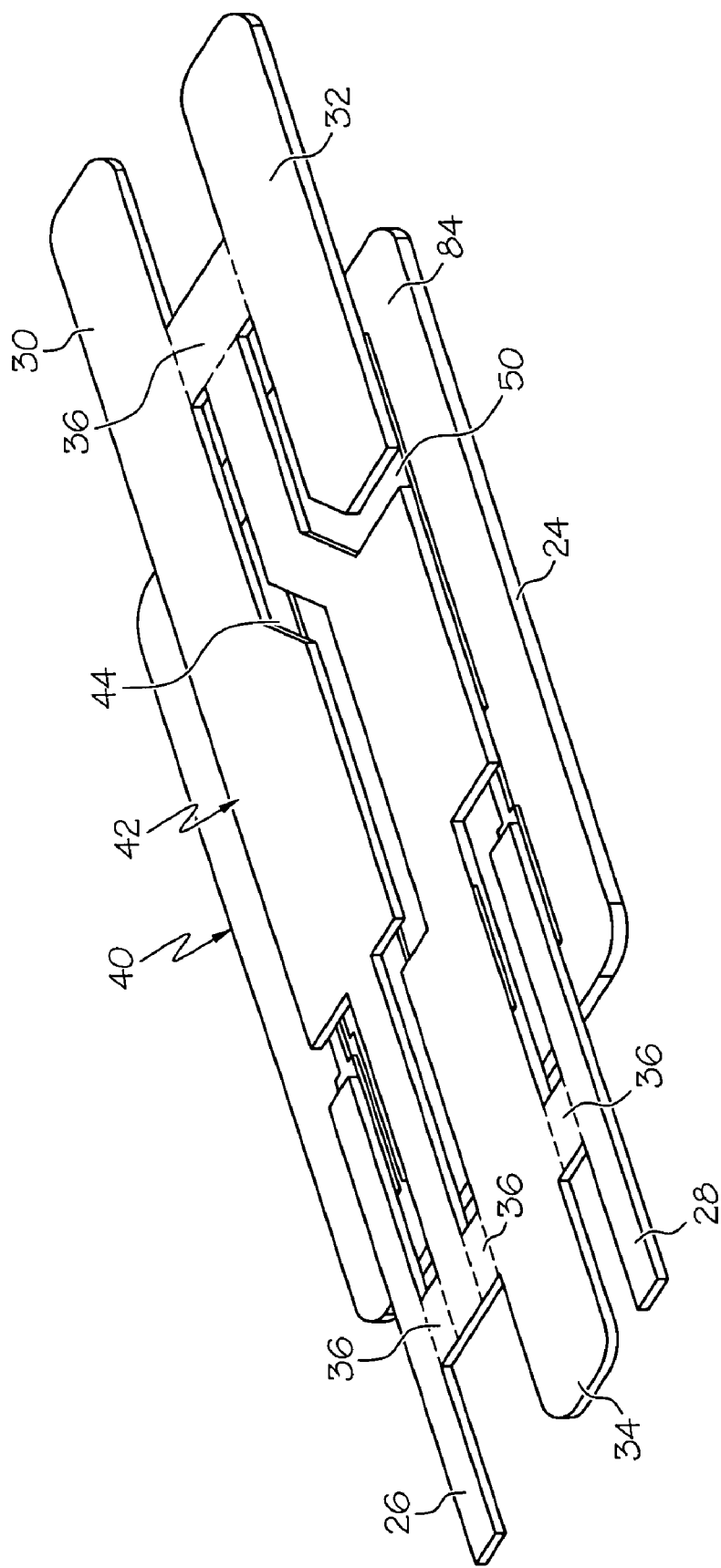
FIG. 2D is an isometric view of an assembly including the lower heatsink and insulated substrate of FIG. 2B, and the leadframe substrate of FIG. 2C.
Figure 2E:
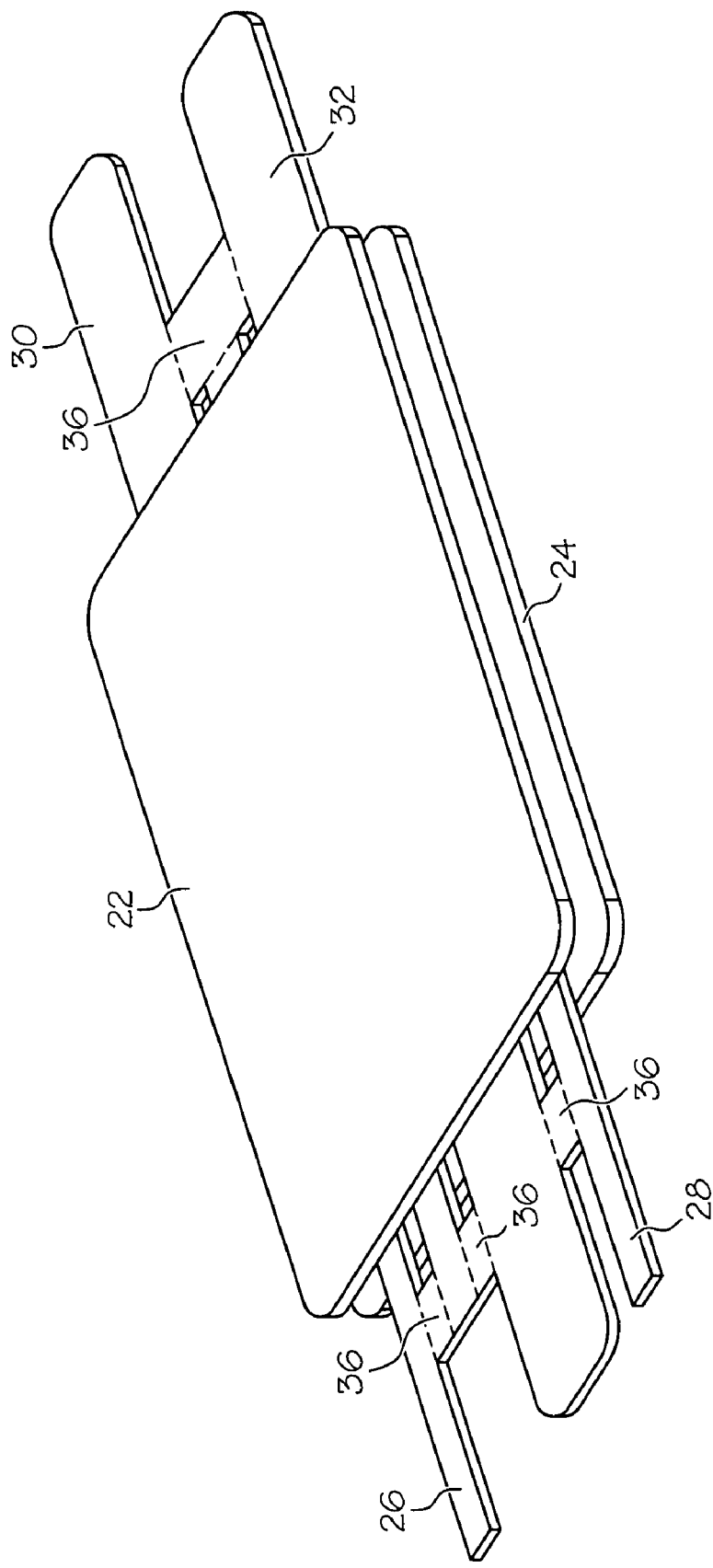
FIG. 2E is an isometric view of the semiconductor power module of FIGS. 1A-1B prior to overmolding.

FIGS. 2A-2E illustrate several successive stages in the manufacture of module 10 of FIGS. 1A-1B. FIG. 2A illustrates an assembly of lower heatsink 24 and an insulated substrate generally designated by the reference numeral 40. FIG. 2B illustrates the assembly of FIG. 2A, with the IGBTs 12, 14 and diodes 16, 18 (all shown in bare die form) bonded to the insulated substrate 40. FIG. 2C illustrates the inboard side of a leadframe substrate, generally designated by the reference numeral 42, and FIG. 2D illustrates the assembly of FIG. 2B, with the leadframe substrate 42 bonded to insulated substrate 40 and the top faces of IGBTs 12, 14 and diodes 16, 18. And finally, FIG. 2E illustrates the assembly of FIG. 2D, with the upper heatsink 22 mounted on the leadframe substrate 42.

Referring to the FIGS. 2A-2B, the insulated substrate 40 includes a set of copper pads 44, 46, 50, 52 that provide mounting surfaces 56, 58, 60, 62, 64, 66, 68, 70, 72, 74 for the IGBTs 12-14, diodes 16-18, and leadframe substrate 42. In the illustrated embodiment, the lower heatsink 24 is fabricated of a conductive material such as aluminum, and the copper pads 44, 46, 50, 52 are insulated from the lower heatsink by an insulation layer 84 deposited on the its inboard face. The copper pads 44, 46, 50, 52 could be fabricated as a single copper conductor, such as a leadframe substrate, with the metal bridge segments removed after overmolding as described above. In applications where the lower heatsink 24 is fabricated of an electrically insulative material such as ceramic, the insulation layer 84 may be omitted. In the illustrated embodiment, the mounting surfaces 56, 58, 60, 62, 64, 66, 68, 70, 72, 74 are defined by solder paste deposited using a conventional plating and masking process, as can be seen in FIG. 2A. The mounting surfaces 56 and 58 correspond to the emitter and gate contacts of IGBT 12; the mounting surfaces 60 and 62 correspond to the emitter and gate contacts of IGBT 14; and the mounting surfaces 64 and 66 correspond to the anode contacts of diodes 16 and 18. The mounting surfaces 68, 70, 72 and 74 are aligned for engagement with the leadframe substrate 42, and are augmented in height by a set of copper spacers 90, 92, 94, 96 having a thickness that matches that of IGBTs 12-14 and diodes 16-18, so that the upper surfaces of IGBTs 12-14, diodes 16-18 and spacers 90-96 are substantially co-planar.

Referring to FIGS. 2C-2D, the leadframe segments 26, 28, 30, 32, 34 of leadframe substrate 42 are provided with mounting surfaces 100-114 that align with the IGBTs 12-14, diodes 16-18 and spacers 90-96. The mounting surfaces 100-114 may be formed in the same fashion as the mounting surfaces 56, 58, 60, 62, 64, 66, 68, 70, 72, 74 of the insulated substrate 40. The mounting surface 100 formed on leadframe segment 26 mates with the copper spacer 94 so that the outboard end of leadframe segment 26 defines the gate terminal G1 of the power module 10. Similarly, the mounting surface 102 formed on leadframe segment 28 mates with the copper spacer 96 so that the outboard end of leadframe segment 28 defines the gate terminal G2. The mounting surfaces 104 and 106 formed on leadframe segment 30 respectively mate with the upper face (collector) of IGBT 12 and the upper face (cathode) of diode 16 so that the outboard end of leadframe segment 30 defines the DC+terminal of the power module 10. The mounting surface 108 formed on leadframe segment 32 mates with the copper spacer 90 so that the outboard end of leadframe segment 32 defines the DC-terminal of the power module 10. And finally, the mounting surfaces 110, 112 and 114 formed on leadframe segment 34 respectively mate with the copper spacer 92, the upper face (collector) of IGBT 14 and the upper face (cathode) of diode 18 so that the outboard end of leadframe segment 34 defines the ACPH terminal of the power module 10.

Referring to FIG. 2E, the upper heatsink 22 is mounted atop the leadframe substrate 42. In the illustrated embodiment, the upper heatsink 22 is fabricated of a conductive material such as aluminum, and an insulation layer (not shown) is deposited on its inboard face to electrically insulate heatsink 22 from the leadframe substrate 42. As with the lower heatsink 24, the upper heatsink 22 may alternately be fabricated of an electrically insulative material such as ceramic, in which case the insulation layer may be omitted. The assembly depicted in FIG. 2E is then selectively overmolded to form the power module depicted in FIGS. 1A-1B, and the exposed bridge segments 36 of leadframe substrate 42 are removed to complete the fabrication process.

In summary, the leaded semiconductor power module 10/10' of the present invention is characterized by its ease of assembly, low-cost, improved reliability due to the elimination of wire bonds, and double-sided cooling. The overmolded encapsulant 20 seals around the components and solder joints, and mechanically isolates the components and solder joints from terminal stress during removal of the bridge segments 36 and subsequent installation in a product.

While the present invention has been described with respect to the illustrated embodiment, it is recognized that numerous modifications and variations in addition to those mentioned herein will occur to those skilled in the art. For example, the copper spacers 90-96 may be formed on the leadframe substrate 42 instead of the insulated substrate 40, the insulated substrate 40 may be formed on the upper heatsink 22 instead of the lower heatsink 24, and so on. Accordingly, it is intended that the invention not be limited to the disclosed embodiment, but that it have the full scope permitted by the language of the following claims.

The invention claimed is:

1. A leaded semiconductor power module, comprising:
   a first heatsink having an electrically insulative inboard face;
   at least one conductor pad formed on said insulative inboard face and defining a mounting surface;
   at least one semiconductor chip having first and second faces on which are formed first and second terminals, respectively, said first face being directly attached to said mounting surface such that said first terminal is electrically coupled to said conductor pad;
   a leadframe substrate having a first segment directly attached to the second face of said semiconductor chip such that said first segment is also electrically coupled to the second terminal of semiconductor chip, and a second segment directly attached to said mounting surface such that said second segment is also electrically coupled to said conductor pad;
   a second heatsink thermally coupled to the leadframe substrate but electrically insulated therefrom; and
   a molded encapsulant that exposes outboard surfaces of the first and second heatsinks, and lead ends of said first and second segments.

2. The leaded semiconductor power module of claim 1, further comprising:
   a conductive spacer disposed between the mounting surface of said conductor pad and the second segment of said leadframe substrate, said conductive spacer having a thickness that matches a thickness of said semiconductor chip.

3. The leaded semiconductor power module of claim 1, where:
   said encapsulant encapsulates said first heatsink, said electrically insulated substrate, said semiconductor chip, said leadframe substrate, and said second heatsink.

4. The leaded semiconductor power module of claim 1, where:
   heat generated by said semiconductor chip is dissipated from said semiconductor power module via the exposed exterior surfaces of the first and second heatsinks.

5. The leaded semiconductor power module of claim 1, where:
   said leadframe substrate includes bridge segments structurally coupling the lead ends of said first and second segments; and
   said encapsulant exposes said bridge segments for subsequent removal to electrically isolate said first and second segments.

* * * * *